(12) United States Patent
Murano et al.

(10) Patent No.: US 10,971,400 B2
(45) Date of Patent: Apr. 6, 2021

(54) SEMICONDUCTOR DEVICE, SUBSTRATE FOR SEMICONDUCTOR DEVICE AND METHOD OF MANUFACTURING THE SEMICONDUCTOR DEVICE

(71) Applicant: TOSHIBA MEMORY CORPORATION, Tokyo (JP)

(72) Inventors: Masahiko Murano, Mie (JP); Fumito Shoji, Mie (JP); Tatsuo Migita, Aichi (JP); Ippei Kume, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,236

(22) Filed: Sep. 2, 2019

(65) Prior Publication Data

US 2020/0273749 A1  Aug. 27, 2020

(30) Foreign Application Priority Data

Feb. 27, 2019 (JP) .............................. JP2019-033978

(51) Int. Cl.
| | |
|---|---|
| *H01L 21/768* | (2006.01) |
| *H01L 21/687* | (2006.01) |
| *C25D 5/02* | (2006.01) |
| *C25D 7/12* | (2006.01) |

(52) U.S. Cl.
CPC .......... *H01L 21/76898* (2013.01); *C25D 5/02* (2013.01); *C25D 7/12* (2013.01); *H01L 21/68721* (2013.01); *H01L 21/76873* (2013.01)

(58) Field of Classification Search
CPC ......... H01L 21/76898; H01L 21/76873; H01L 21/68721; C25D 7/12; C25D 5/02
USPC .......................................................... 438/667
See application file for complete search history.

(56) References Cited

U.S. PATENT DOCUMENTS

| | | | | |
|---|---|---|---|---|
| 7,374,972 | B2 * | 5/2008 | Kwon ................... | H01L 23/053 438/113 |
| 9,598,275 | B2 * | 3/2017 | Chien ................. | B81C 1/00293 |
| 2005/0274604 | A1 | 12/2005 | Saito et al. | |
| 2019/0333963 | A1 * | 10/2019 | Chio ..................... | H01L 27/156 |

FOREIGN PATENT DOCUMENTS

| | | |
|---|---|---|
| JP | 2002-249899 A | 9/2002 |
| JP | 2008-42106 A | 2/2008 |

* cited by examiner

*Primary Examiner* — Vu A Vu
(74) *Attorney, Agent, or Firm* — Kim & Stewart LLP (57) ABSTRACT

A semiconductor device includes a device layer having a semiconductor element and a wiring layer, a first structure, a second structure at an outer periphery of the first structure and having a thickness smaller than that of the first structure, and a conductive layer that covers the first structure and the second structure. The first structure comprises a first substrate having the device layer formed on a first surface thereof and a through hole formed through a second surface thereof that is opposite to the first surface to reach the device layer, and an inner portion of a second substrate facing the first surface and bonded to the first surface by a first adhesive layer.

19 Claims, 11 Drawing Sheets

SEMICONDUCTOR DEVICE, SUBSTRATE FOR SEMICONDUCTOR DEVICE AND METHOD OF MANUFACTURING THE SEMICONDUCTOR DEVICE

CROSS-REFERENCE TO RELATED APPLICATIONS

This application is based upon and claims the benefit of priority from Japanese Patent Application No. 2019-033978, filed Feb. 27, 2019, the entire contents of which are incorporated herein by reference.

FIELD

Embodiments described herein relate generally to a semiconductor device, a substrate for the semiconductor device and a method of manufacturing the semiconductor substrate.

BACKGROUND

A spouted wafer plating apparatus that performs plating of a wafer processing surface by a face-down method, is known. In a conventional face-down method, the wafer processing surface is faced downward. Then, a peripheral portion of the wafer processing surface is covered with a mask member, and electrodes are pressed against the peripheral portion of the wafer processing surface inside the mask member.

In the conventional method, when the wafer becomes thinner, a crack may occur in the wafer when the electrodes are pressed against the peripheral portion of the wafer processing surface.

DETAILED DESCRIPTION

In general, according to an embodiment, a semiconductor device comprises a device layer including a semiconductor element and a wiring layer, a first structure, a second structure at an outer periphery of the first structure and having a thickness smaller than that of the first structure, and a conductive layer that covers the first structure and the second structure. The first structure comprises a first substrate having the device layer formed on a first surface thereof and a through hole formed through a second surface thereof that is opposite to the first surface to reach the device layer, and an inner portion of a second substrate facing the first surface and bonded to the first surface by a first adhesive layer.

The semiconductor device and the manufacturing method of the semiconductor device according to the embodiment will be described in detail with reference to the drawings. The present invention is not limited by these embodiments. In addition, the cross-sectional views of the semiconductor device used in the following embodiments are schematic, and the relationship between the thickness and the width of the layer, the ratio of the thickness of each layer, and the like may be different from actual ones. The film thickness described in the following embodiment is an example, and is not limited to that described.

First Embodiment

Figure 1A:
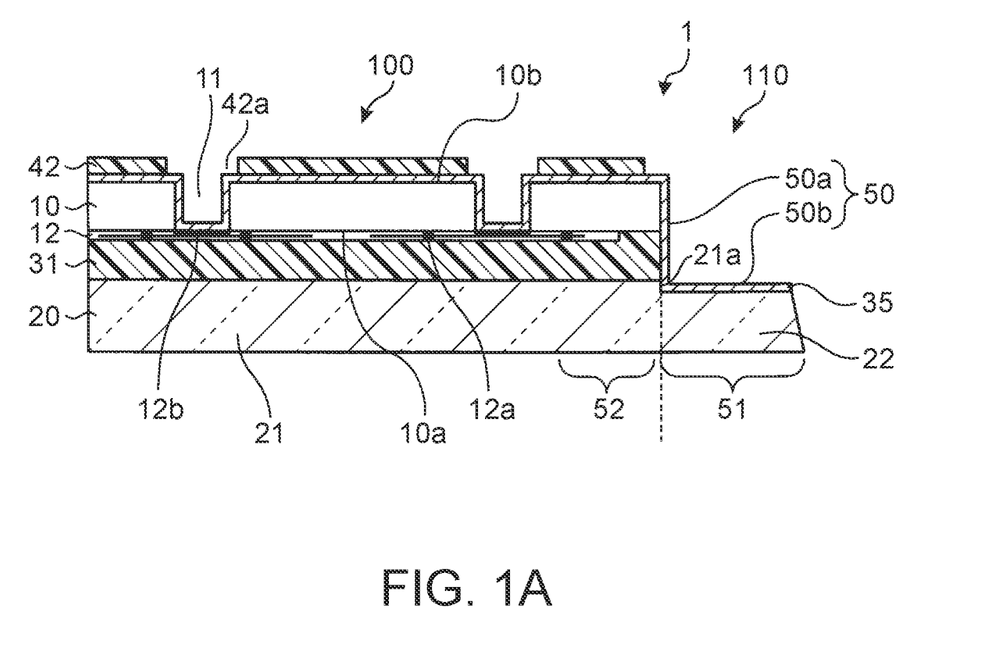
FIG. 1A is a partial cross-sectional view schematically illustrating an example of a structure of a peripheral portion of a semiconductor device according to a first embodiment.
Figure 1B:
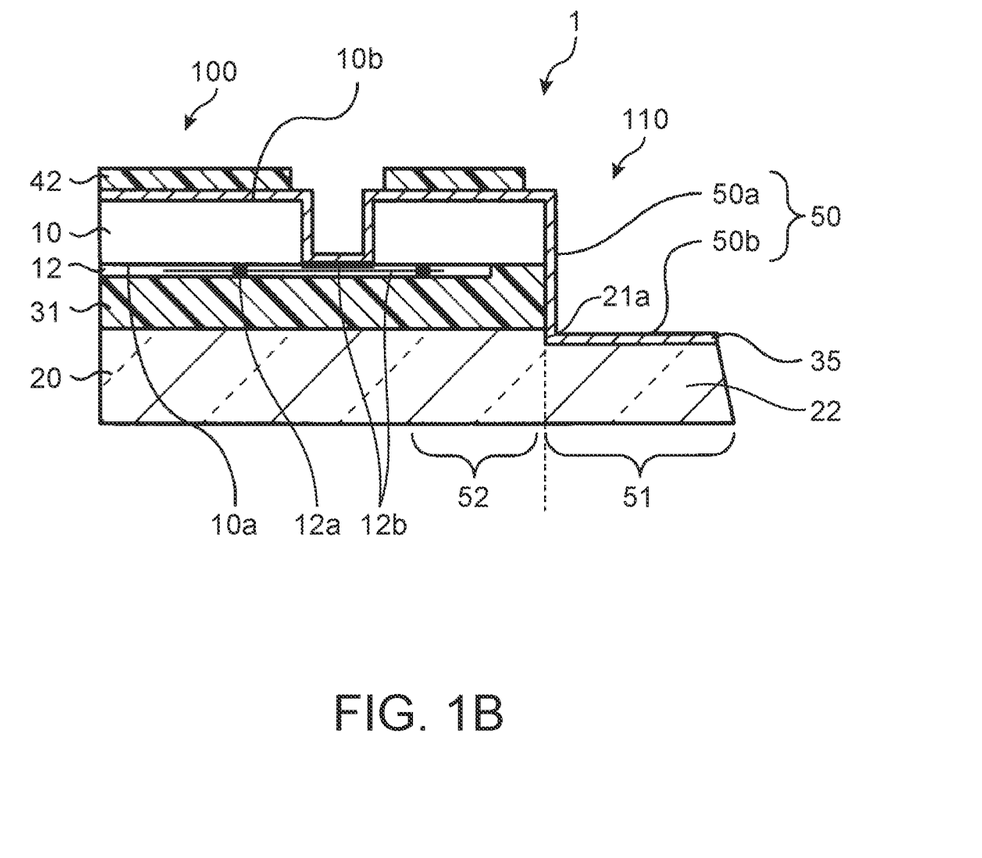
FIG. 1B is a partial enlarged cross-sectional view schematically illustrating an example of a structure of a peripheral portion of a semiconductor device according to a first embodiment.

FIG. 1A is a partial cross-sectional view schematically illustrating an example of a structure of a peripheral portion of a semiconductor device according to a first embodiment. FIG. 1B is a partial enlarged cross-sectional view schematically illustrating an example of a structure of a peripheral portion of a semiconductor device according to a first embodiment. The semiconductor device 1 includes a semiconductor substrate 10 (which may be referred to herein as a "first substrate"), a second inner substrate 21, a second outer substrate 22, a first adhesive layer 31, and a seed layer 35, which is a conductive layer. The second inner substrate 21 and the second outer substrate 22 together form a support substrate 20 (which may be referred to herein as a "second substrate"). In this embodiment, the second outer substrate 22 extends from the second inner substrate 21. A boundary between the second inner substrate 21 and the second outer substrate 22 is indicated by a dotted line in FIGS. 1A and 1B. A device layer 12 includes various semiconductor elements 12a such as a field effect transistor, a resistance element and a memory element. The device layer 12 also includes a plurality of wiring layers 12b. The device layer is provided on a first surface 10a of the semiconductor substrate 10. A through hole 11 that reaches the device layer 12 from a second surface 10b of the semiconductor substrate 10, which is a surface opposite to the first surface 10a, is formed through the semiconductor substrate 10. For example, the wiring layer 12b is exposed at the bottom of the through hole 11. The semiconductor substrate 10 is ground and thinned to a thickness of 30 µm to 100 µm. The illustrations of the semiconductor element 12a and the wiring layer 12b are omitted in the following figures.

The second inner substrate 21 supports the semiconductor substrate 10 in order to increase the strength thereof so that the semiconductor substrate 10 is not broken during a plating process. An outer shape of the second inner substrate 21 is substantially the same as that of the semiconductor substrate 10 when viewed from above. In one example, the semiconductor substrate 10 is a silicon substrate.

The second outer substrate 22 is provided around the outer periphery of the second inner substrate 21. The second outer substrate 22 is contiguous to the second inner substrate 21. The thickness of the second outer substrate 22 is thinner than that of the second inner substrate 21. The second outer substrate 22 has a flat tread 50b (which may be referred to herein as a "third surface"). The tread 50b is closer to the first surface 10a than the second surface 10b. The second outer substrate 22 may be referred to herein as a "second structure 110".

A step surface 21a is formed on the step between the second inner substrate 21 and the second outer substrate 22.

The semiconductor substrate 10 and the second inner substrate 21 are bonded to each other with the first adhesive layer 31 at a peripheral portion of the semiconductor substrate 10 to form a first structure 100. A riser 50a (which may be referred to herein as a "fourth surface") is made up of a side surface of the semiconductor substrate 10, a side surface of the first adhesive layer 31, and the step surface 21a. The riser 50a may be referred to as the side surface exposed on the outside of first structure 100. A step structure 50 is includes the riser 50a and the tread 50b. The first adhesive layer 31 is provided within a predetermined range from the outer edge of between the semiconductor substrate 10 and the second inner substrate 21, for example, within a range of several mm. A release layer may be provided in a region (not shown) other than the peripheral portion of between the semiconductor substrate 10 and the second inner substrate 21. The first adhesive layer 31 may be provided in such a region also. The first adhesive layer 31 includes, for example, a resin material that allows the semiconductor substrate 10 to peel off from the second inner substrate 21 when it is irradiated by ultraviolet light. For example, a urethane resin or an epoxy resin is used as the first adhesive layer 31. The release layer contains a resin material having no adhesive properties. The first adhesive layer 31 and the release layer have a thickness of, for example, several tens of μm.

The riser 50a is a surface formed along a direction perpendicular to the surface of the second inner substrate 21 or the second outer substrate 22. The riser 50a may be an inclined surface. The end of the riser 50a connects the end of the tread 50b. The tread 50b provides an electrode contact area 51. The electrode contact area 51 is a portion against which the electrode of face-down type spouted wafer electroplating apparatus is pressed.

A seed layer 35 is a conductive layer that is provided on the second surface 10b as an electrode layer during a plating process. As such, the seed layer 35 includes a conductive material. The seed layer 35 is, for example, a Cu film. Further, the seed layer 35 may include a barrier metal film such as a Ti film under the Cu film in order to suppress the diffusion of the Cu into the semiconductor substrate 10 and/or the device layer 12. The seed layer 35 covers an inner surface of through hole 11, a bottom of the through hole 11, the tread 50b, the riser 50a, and the second surface 10b. However, there may be portions of the tread 50b, the riser 50a, the second surface 10b, the inner surface of the through hole 11, and the bottom of the through hole 11 that are not covered by the seed layer 35.

A resist pattern 42 (which may be referred to herein as an "insulation pattern") is provided at a predetermined position on the second surface 10b on which the seed layer 35 is provided. The resist pattern 42 has an opening 42a corresponding to the position of the through hole 11 of the semiconductor substrate 10. The opening 42a corresponds to a position of a connecting electrode. The diameter of the opening 42a is larger than the diameter of the through hole 11. The material of the resist pattern 42, may be, for example, a photoresist exposed by ArF (193 nm), KrF (248 nm), i-line (365 nm), electron beam (Electron Beam) or the like.

A peripheral portion of the second surface 10b of the semiconductor substrate 10 adjacent to the electrode contact area 51 is a seal contact area 52 at which a seal member 222 (see FIG. 2) is in contact during the plating process.

The electrode contact area 51 on which the electrode is pressed during the plating process is provided not on the semiconductor substrate 10 but on the second outer substrate 22. Therefore the electrode is not pressed against the semiconductor substrate 10 during the plating process.

Figure 2:
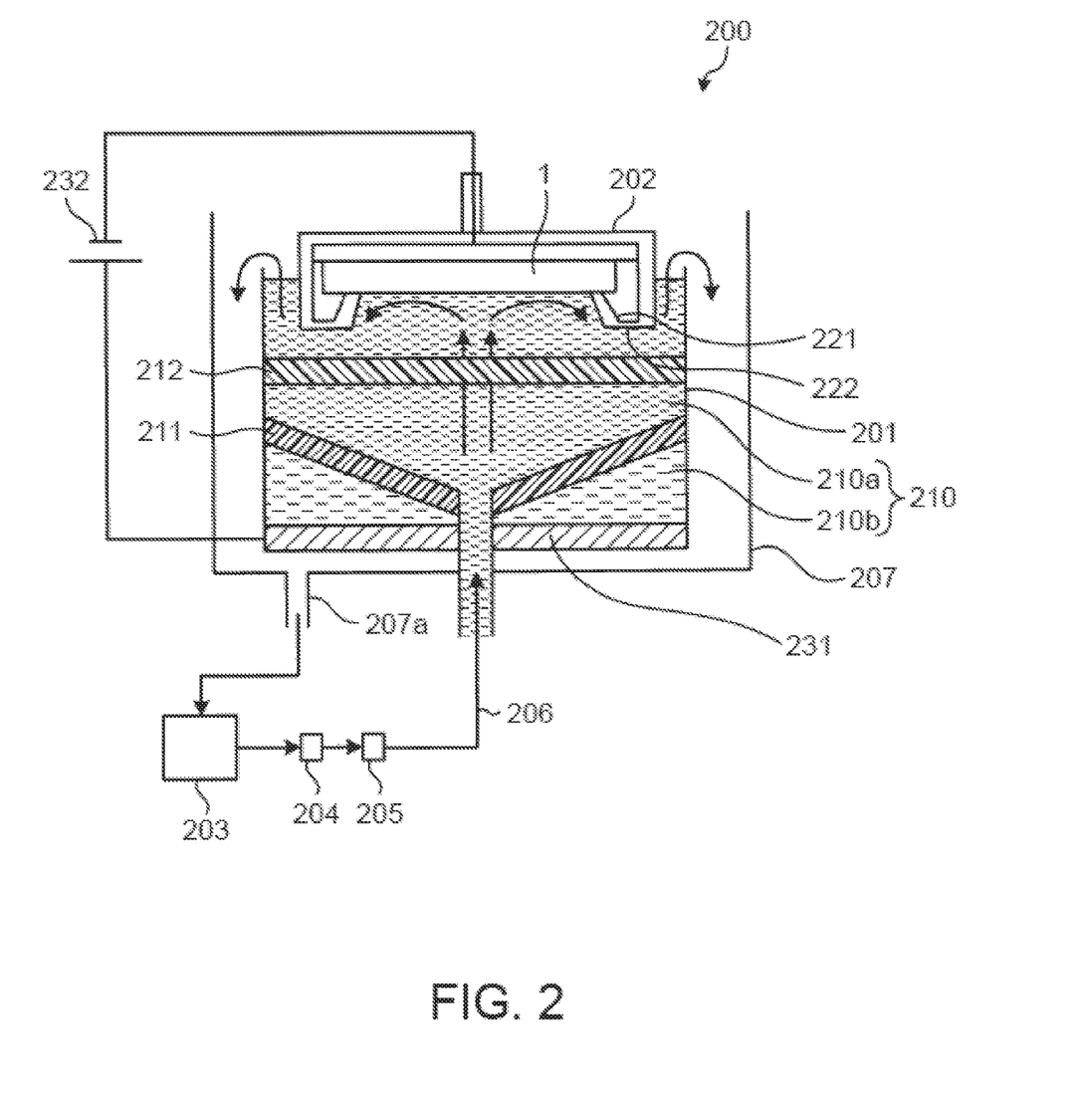
FIG. 2 is a view schematically illustrating an example of a structure of a plating apparatus.

The configuration of the face-down type spouted wafer electroplating apparatus used for the plating process of the semiconductor device 1 is now described. FIG. 2 schematically illustrates an example of the configuration of a plating apparatus. The plating apparatus 200 includes a plating tank 201 for storing a plating solution 210, and a substrate holding unit 202 for holding the semiconductor device 1 above the plating tank 201. The substrate holding unit 202 holds the semiconductor device 1 with the surface of the semiconductor device 1 to be processed (i.e., the plated surface) facing downward. For example, the semiconductor device 1 is held with the surface on which the seed layer 35 is formed facing downward.

The plating apparatus 200 includes the plating tank 201, the substrate holding unit 202, a plating solution storage tank 203, a pump 204, a filter 205, a pipe 206 and a recovery tank 207. The plating solution storage tank 203 stores the plating solution 210. The pump 204 supplies the plating solution 210 in the plating solution storage tank 203 to the lower part of the plating tank 201. The filter 205 removes foreign matter in the plating solution 210 supplied by the pump 204. The pipe 206 connects the plating solution storage tank 203, the pump 204, the filter 205 and the plating tank 201.

The recovery tank 207 is disposed outside the plating tank 201, and recovers the plating solution 210 overflowed from the plating tank 201. At the bottom of the recovery tank 207, a discharge port 207a is provided. The discharge port 207a is connected to the plating solution storage tank 203 with the pipe 206.

The substrate holding unit 202 includes a plurality of electrodes 221 and the seal member 222. The plurality of electrodes 221 are provided along the periphery of the semiconductor device 1. The seal member 222 covers the peripheral portion of the semiconductor device 1 with which the plurality of electrodes 221 is in contact. When the semiconductor device 1 is held by the substrate holding unit 202, the seal contact area 52 of the semiconductor device 1 and the electrode contact area 51 of the semiconductor device 1 are covered, and the other areas of the semiconductor device 1 are exposed. In addition, since the plurality of electrodes 221 is covered by the seal member 222, the plurality of electrodes 221 do not contact the plating solution 210. The electrodes 221 contact the seed layer 35 formed on the treads 50b at a plurality of points.

The plating apparatus 200 includes an electrode 231 and a power source 232. The electrode 231 includes Cu and is provided at the bottom of the plating tank 201. The power source 232 is connected to the electrode 231 provided on the bottom of the plating tank 201 and the electrode 221 provided on the substrate holder 202 with wiring. The electrode 231 is connected to a positive electrode of the power source 232, and the electrode 221 of the substrate holder 202 is connected to a negative electrode of the power source 232. That is, the electrode 231 is an anode, and the electrode 221 is a cathode.

An anode membrane 211 is provided in the plating tank 201. The anode membrane 211 is an ion exchangeable filter that separates the plating solution 210a at the cathode side and the plating solution 210b at the anode side in the plating tank 201. A plating solution diffusion filter 212 for rectifying and cleaning the plating solution 210a is provided at the cathode side of the plating tank 201, i.e., on the side where the plating solution 201a is present.

With the semiconductor device 1 held in contact with the plating solution 210, the pump 204 ejects the plating solution 210 in the plating solution storage tank 203 through the bottom of the plating tank 201 via the filter 205. At this time, the power supply 232 applies a predetermined voltage between the electrode 231 and the electrode 221 (and the seed layer 35 of the semiconductor device 1). A plating current flows between the electrode 231 and the seed layer 35, and a plating film is formed on the seed layer 35 that is in contact with the plating solution 210.

A manufacturing method of the semiconductor device 1 will be described. FIG. 3A to FIG. 3H are each a partial cross sectional view of a peripheral portion of a semiconductor device, and illustrate an example of a method of manufacturing the semiconductor device according to the first embodiment.

Figure 3A:
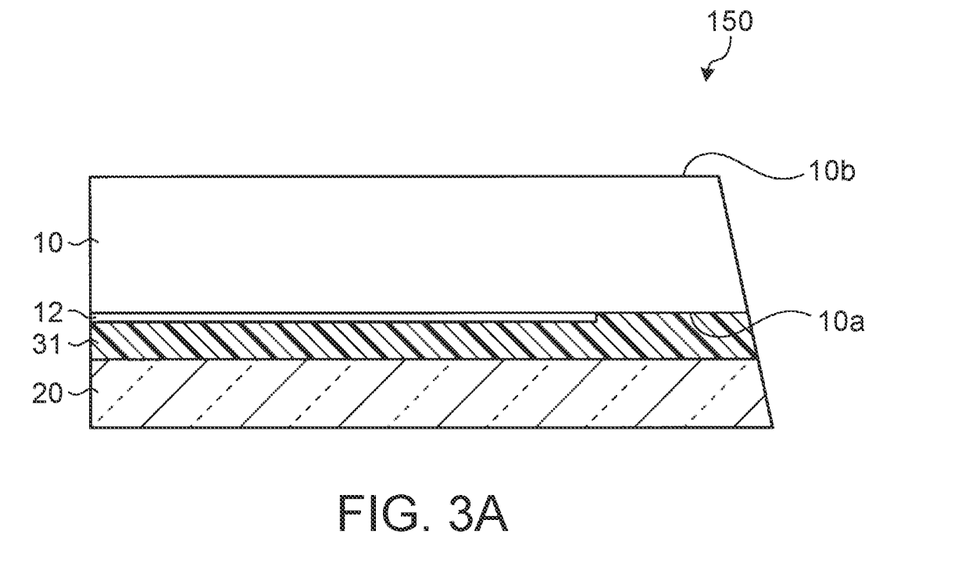
FIG. 3A to FIG. 3H are each a partial cross-sectional view of a peripheral portion of a semiconductor device, and illustrate an example of a method of manufacturing a semiconductor device according to the first embodiment.

At first, as illustrated in FIG. 3A, the first surface 10a of the semiconductor substrate 10 and the support substrate 20 are bonded via the first adhesive layer 31 to form a stack 150. The device layer 12 including the semiconductor elements and the wiring layers (not shown) is disposed on the first surface 10a of the semiconductor substrate 10. The first adhesive layer 31 is provided on the peripheral portion of the semiconductor substrate 10, and the release layer (not shown) is provided on the other portion. However, the first adhesive layer 31 may be provided in such a region (not shown) also. The semiconductor substrate 10 has not been ground yet, and has a thickness greater than 100 μm. The supporting substrate 20 has a thickness that is large enough to prevent a crack when the electrode 221 is pressed against the supporting substrate 20 during the plating process, and is, for example, 700 μm. The first adhesive layer 31 has a thickness of, for example, several tens of μm. As the supporting substrate 20, a silicon substrate, a glass substrate, or the like can be used.

Figure 3B:
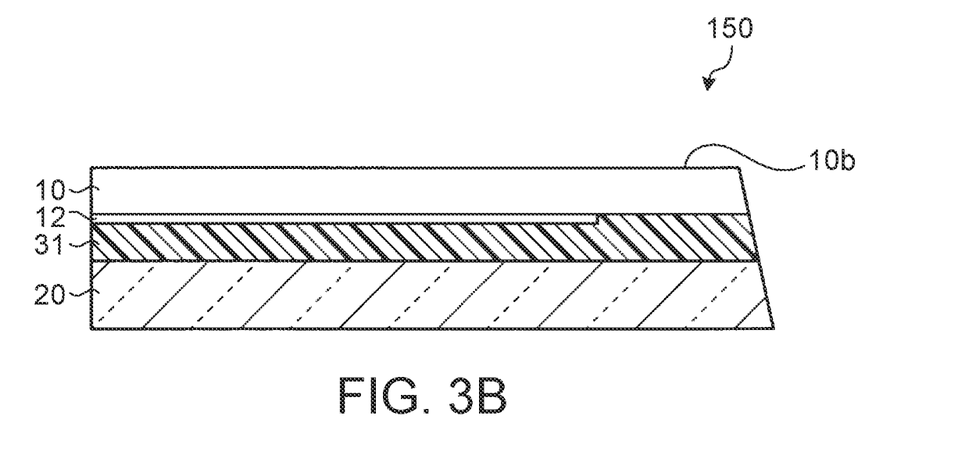

Next, as illustrated in FIG. 3B the semiconductor substrate 10 is polished or ground by a polishing apparatus or a grinding apparatus from the second surface 10b side so that the thickness of the semiconductor substrate 10 becomes 30 μm to 100 μm.

Figure 3C:
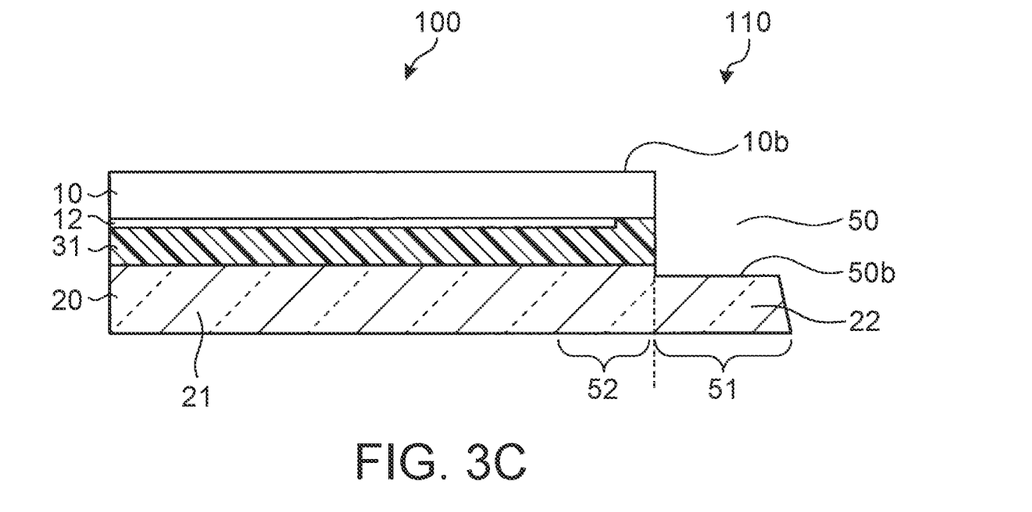

Thereafter, as illustrated in FIG. 3C, the semiconductor substrate 10 and the first adhesive layer 31 at an end portion of the stack 150 are removed by polishing or grinding from the second surface 10b side by a polishing apparatus or a grinding apparatus or the like. At this time, the end portion of the support substrate is also slightly removed in the thickness direction. The thinned portion of the support substrate 20 is referred to as the second outer substrate 22, and the other portion of the support substrate 20 is referred to as the second inner substrate 21. An unground portion of the stack 150 is the first structure 100. The second outer substrate 22 may be referred to herein as a second structure 110. An exposed surface of the second outer substrate 22 is a polished surface or a ground surface. The exposed surface of the second outer substrate 22 is the tread 50b with a flat surface. The tread 50b is provides the electrode contact area 51, and the area on the semiconductor substrate 10 adjacent to the electrode contact area 51 is the seal contact area 52.

Figure 3D:
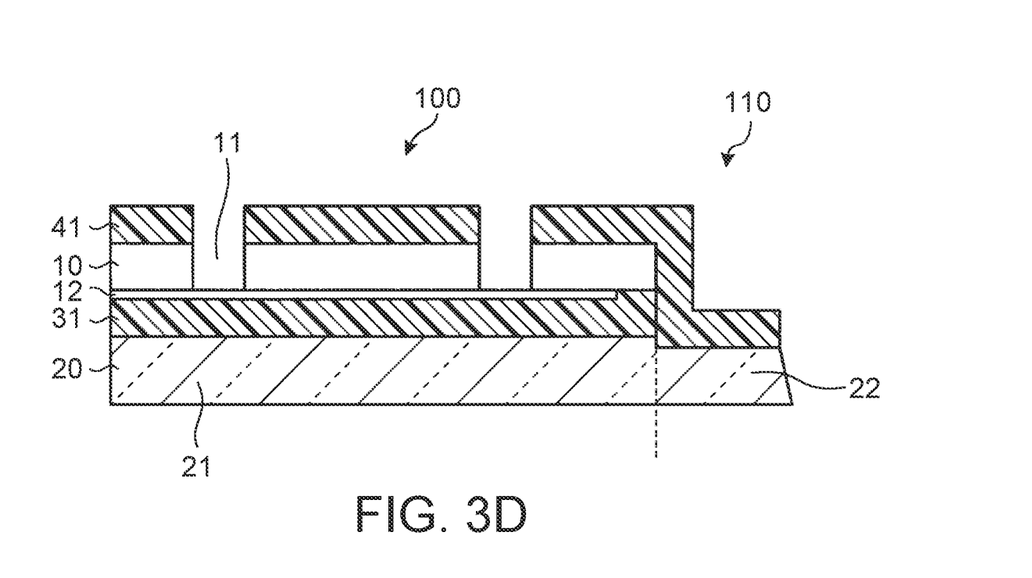

Next, a resist is applied on the second surface 10b side, and exposure processing and development processing are performed to form a resist pattern 41 in which the formation position of the through hole 11 is opened. During this process, the resist may be applied to the riser 50a and the tread 50b. The resist may be organic or inorganic. Thereafter, as illustrated in FIG. 3D, the semiconductor substrate 10 is etched by anisotropic etching such as RIE (Reactive Ion Etching) method using the resist pattern 41 as a mask until the device layer 12 is reached. Thus, the through holes 11 are formed in the semiconductor substrate 10 in correspondence with the positions of the openings in the resist pattern 41. A wiring layer (not shown) is exposed at the bottom of the through holes 11.

Figure 3E:
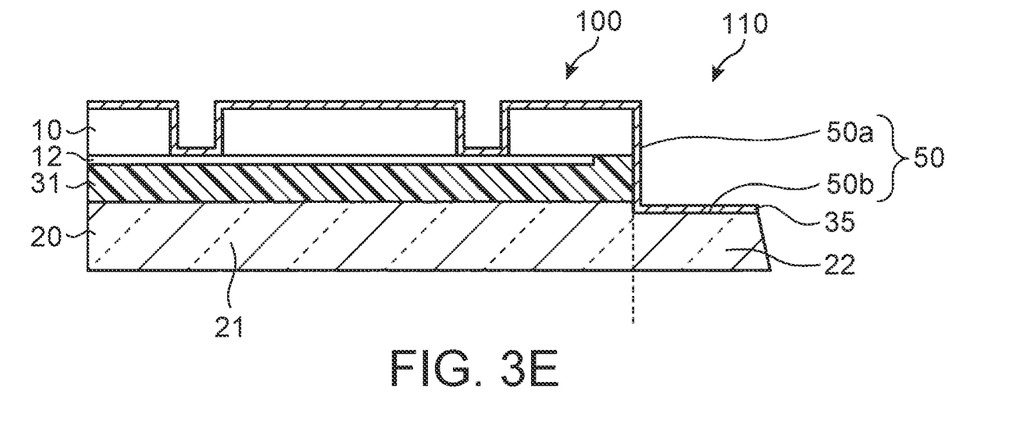

After removing the resist pattern 41, as illustrated in FIG. 3E, the seed layer 35 is formed on the second surface 10b, the riser 50a, the tread 50b, and the side and bottom of the through hole 11. The seed layer 35 is formed by a film forming method such as a sputtering method capable of covering the riser 50a and the side of the through hole 11. For example, the seed layer 35 is formed with a barrier metal film made of Ti having a thickness of several hundred nm and then a Cu film having a thickness of 600 nm. When the riser 50a is inclined, coverage is better than when it is vertical.

Figure 3F:
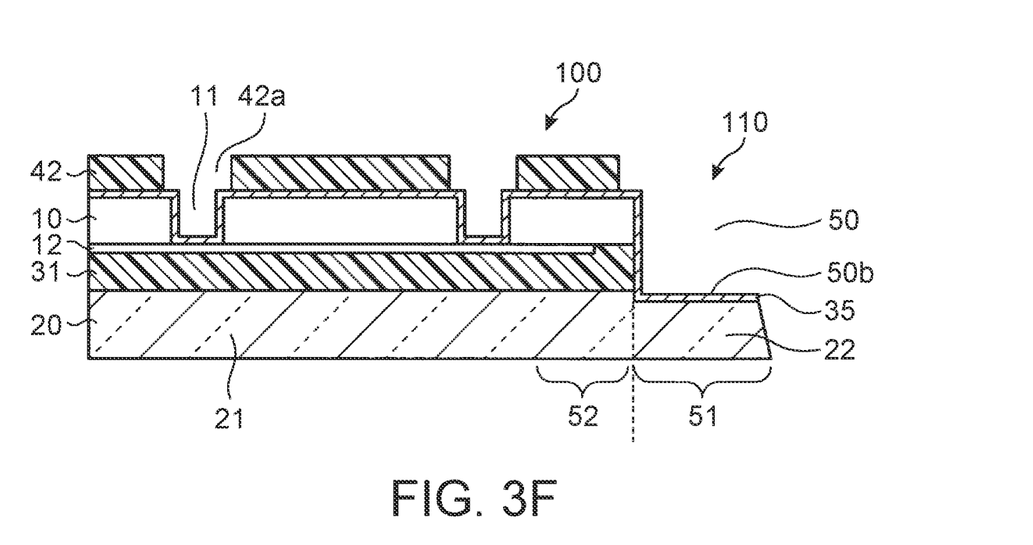

Thereafter, as illustrated in FIG. 3F a resist is applied to the second surface 10b side, and exposure processing and development processing are performed. As a result, a resist pattern 42 (which may be referred to herein as an "insulation pattern") is formed with the connecting electrode formation position opened. During this process, the resist may be applied to the riser 50a and the tread 50b. The resist may be an organic material or an inorganic material as long as it is insulating. The formation positions of the connecting electrode overlap the formation positions of the through holes 11. The diameter of the opening 42a of the resist pattern 42 is larger than the diameter of the through hole 11. Thus, the seed layer 35 is exposed at the position where the connecting electrode is to be formed. Further, the resist pattern 42 is not formed on the tread 50b.

Figure 3G:
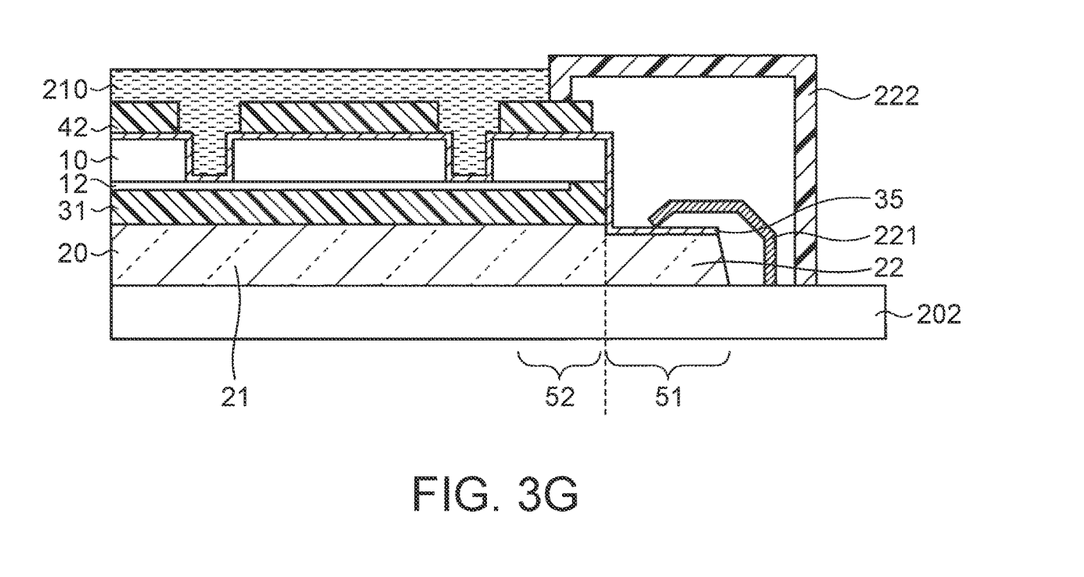

Next, as illustrated in FIG. 3G, the support substrate 20 is held by the substrate holding unit 202 of the plating apparatus 200. As a result, the electrode 221 of the substrate holding unit 202 contacts the seed layer 35 in the electrode contact area 51, and the seal member 222 contacts the resist pattern 42 in the seal contact area 52 to cover the electrode 221. As apparent from the figure, the semiconductor substrate 10 is not present in the electrode contact area 51, and therefore the semiconductor substrate 10 is not cracked as a result of being pressed by the electrode 221. Further, the thickness of the semiconductor substrate 10 is 30 μm or more, and this thickness is large enough to make small the possibility of the semiconductor substrate 10 being cracked at a portion thereof that is pressed by the seal member 222 through the resist pattern 42.

In a state in which the semiconductor substrate 10 is in contact with the plating solution 210 in the plating tank 201 of FIG. 2, the plating process is performed by the plating apparatus 200. When a voltage is applied between the electrode 221 of the substrate holder 202 and the electrode 231 provided at the bottom of the plating tank 201 by the power supply 232, the connection electrode is formed in the exposed region of the seed layer 35. That is, a metal of the connection electrode fills the through hole 11.

Figure 3H:
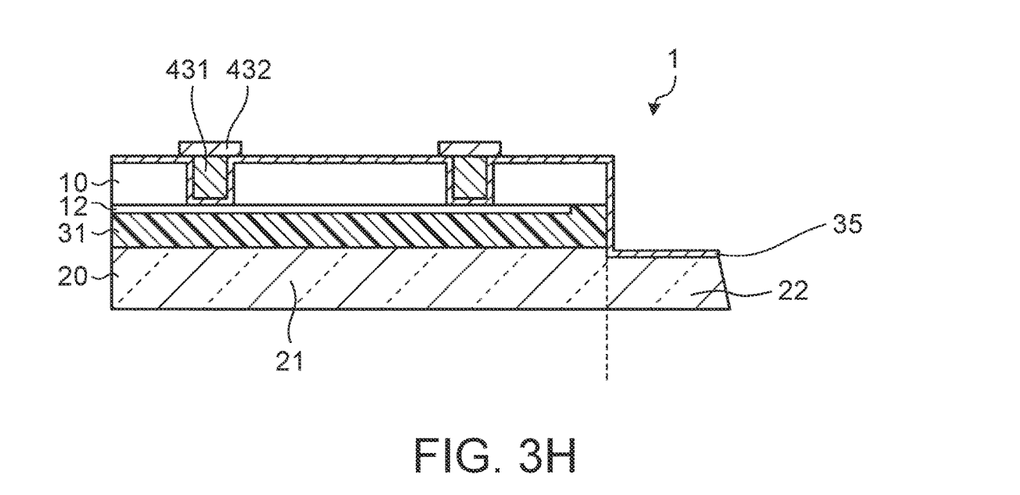

As illustrated in FIG. 3H, after the plating process is completed, the resist pattern 42 is removed by dissolution, asking or the like. A through wiring 431 is formed in the through hole 11 of the semiconductor substrate 10, and a pad 432 integrally formed with the through wiring 431 is formed on the second surface 10b side of the semiconductor substrate 10. The through wiring 431 and the pad 432 form what is known as TSV (Through-Silicon-Via). Then, the resist pattern 42 is removed to obtain the semiconductor device 1 according to the first embodiment. Solder bumps may be further formed on the pads 432. The pad 432 may be formed by the same material as that of the through wiring 431; however, they may be formed with different materials.

The method of manufacturing a semiconductor device according to the first embodiment may be also applied to a semiconductor device of the following embodiments.

In the first embodiment, the electrode 221 does not contact the semiconductor substrate 10, so that the semiconductor substrate 10 can be prevented from being cracked during the plating process.

Second Embodiment

Figure 4:
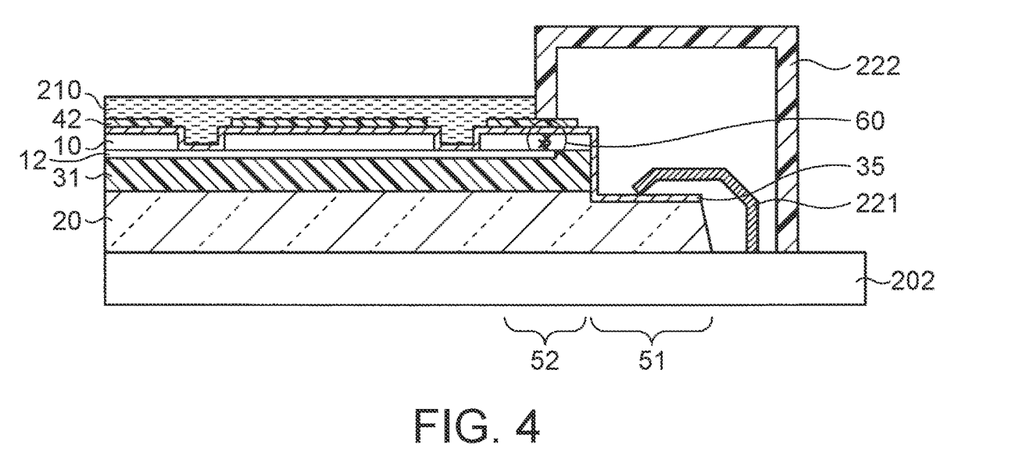
FIG. 4 is a partial cross-sectional view schematically illustrating a plating process when the semiconductor substrate becomes thinner.

The same components as those described in the first embodiment are denoted by the same reference numerals, and the description thereof is omitted. FIG. 4 is a partial cross-sectional view schematically illustrating the plating process when the semiconductor substrate 10 is further thinned relative to the first embodiment. FIG. 4 schematically illustrates a state in which the semiconductor device is held by the substrate holding unit 202 of the plating apparatus 200 and plating is performed. Here, the case where the thickness of the semiconductor substrate 10 is thinner than that of the first embodiment and less than 30 μm is illustrated. When the thickness of the semiconductor substrate 10 is less than 30 μm, the possibility of the crack 60 being generated at the position of the semiconductor substrate 10 corresponding to the contact position with the seal member 222 becomes high. Therefore, in the second embodiment, the semiconductor device 1 will be described which suppresses the occurrence of the crack 60 in the semiconductor substrate 10 in the seal contact area 52.

Figure 5:
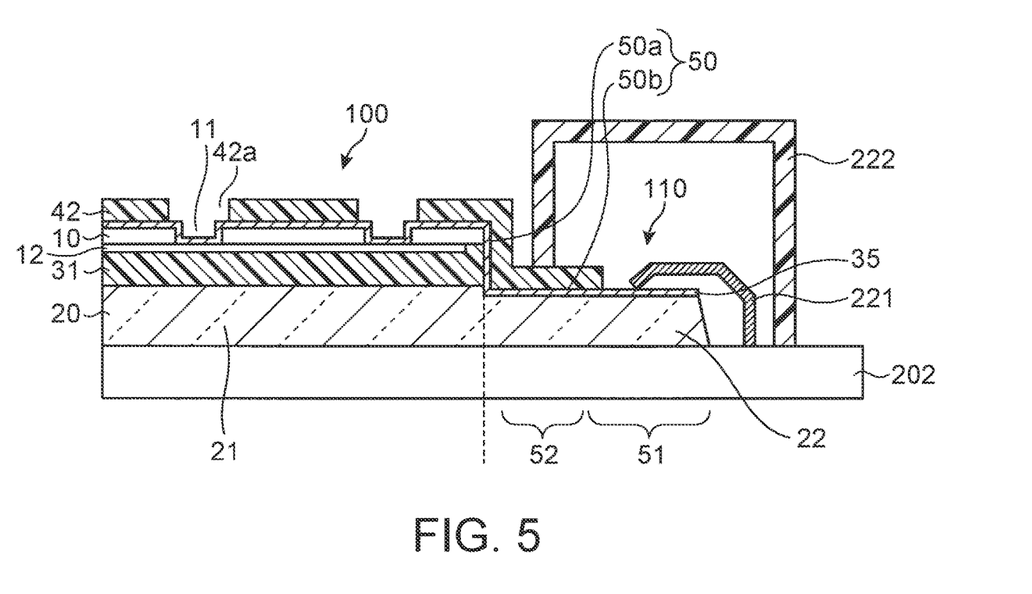
FIG. 5 is a partial cross-sectional view schematically illustrating an example of a structure of a peripheral portion of a semiconductor device according to a second embodiment.

FIG. 5 is a partial cross-sectional view schematically illustrating an example of the configuration of the semiconductor device according to the second embodiment. Here, a state in which the semiconductor device 1 is held by the substrate holding unit 202 of the plating apparatus 200 is illustrated. As illustrated in FIG. 5, the radial length of the tread 50b is longer than in the first embodiment, so that the electrode 221 and the sealing member 222 of the substrate holding part 202 are in contact with the tread 50b. That is, the electrode contact area 51 and the seal contact area 52 are provided on the tread 50b. The resist pattern 42 may be provided on the riser 50a and the tread 50b. An area above the semiconductor substrate 10 and a region above the seal contact area 52 are covered by the resist pattern. An area covered with the resist pattern 42 in the tread 50b is in the seal contact area 52.

As described above, the thickness of the semiconductor substrate 10 is thinner than in the case of the first embodiment, and is greater than 0 μm and less than 30 μm.

During the plating process, the electrode 221 is disposed on the electrode contact area 51 of the tread 50b, and the seal member 222 is disposed on the seal contact area 52 of the tread 50b. That is, since the electrode 221 and the seal member 222 are not disposed on the semiconductor substrate 10, the generation of a crack in the semiconductor substrate 10 can be suppressed even when the electrode 221 and the seal member 222 press against the semiconductor device 1.

In the second embodiment, when the semiconductor substrate 10 has a thickness of less than 30 μm, the radial length of the tread 50b is longer than that of the first embodiment. During the plating process, the electrode 221 and the seal member 222 are pressed on the tread 50b. As a result, since the electrode 221 and the seal member 222 of the substrate holding unit 202 do not contact the semiconductor substrate 10, the thinned semiconductor substrate 10 is less susceptible to cracking.

Third Embodiment

Figure 6:
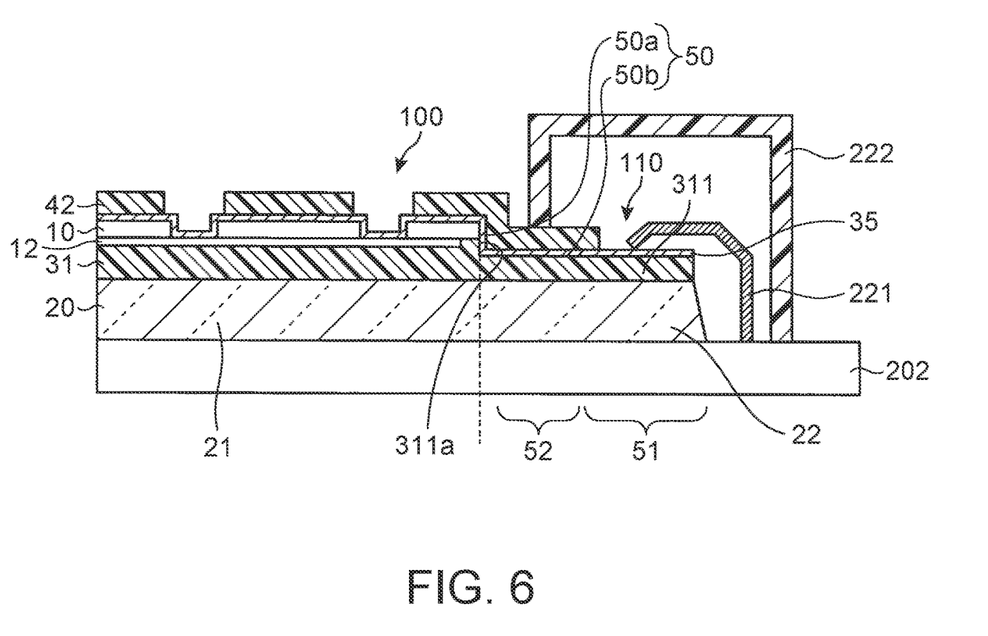
FIG. 6 is a partial cross-sectional view schematically illustrating an example of a structure of a peripheral portion of a semiconductor device according to a third embodiment.

The same components as those described in the first embodiment are denoted by the same reference numerals, and the description thereof is omitted. FIG. 6 is a partial cross-sectional view schematically illustrating an example of the configuration of the semiconductor device according to the third embodiment. A state in which the semiconductor device 1 is held by the substrate holding unit 202 of the plating apparatus 200 is illustrated in the third embodiment. An edge of the semiconductor substrate 10 and a part of an edge of the first adhesive layer 31 are removed. An outer portion of the first adhesive layer 31 which is not removed is referred to herein as a second adhesive layer 311. At this time, a flat surface of the second adhesive layer 311 is referred to as a tread 50b. The side surface of the step formed between the first adhesive layer 31 and the second adhesive layer 311 is referred to as a step surface 311a. The side surface of the semiconductor substrate 10 and the step surface 311a form the riser 50b. Since the support substrate 20 is not ground, the thicknesses of the second inner substrate 21 and the second outer substrate 22 are substantially equal. A stacked structure of the second adhesive layer 311 and the second outer substrate 22 may be referred to herein as a "second structure 110". Even with such a configuration, the electrode 221 and the seal member 222 of the substrate holding unit 202 of the plating apparatus 200 do not come in contact with the semiconductor substrate 10. Therefore, a crack of the semiconductor substrate 10 by the electrode 221 and the seal member 222 pressing against the semiconductor substrate 10 does not occur. The features of the third embodiment may be applied also to the first embodiment, where the seal member 222 presses against the semiconductor substrate 10.

In the third embodiment, the height of the riser 50a is smaller than that of the second embodiment. As a result, steps of the seed layer 35 and steps of the resist pattern 42 become smaller, and the occurrence of disconnection of the seed layer 35 and/or the resist pattern 42 at the riser 50a can be suppressed as compared with the second embodiment.

That is, in addition to the effects of the second embodiment, the effect of being able to provide an excellent coverage of the seed layer 35 and the resist pattern 42 is obtained.

In the semiconductor device 1 according to the first to the third embodiments, after forming the through wiring 431 and the pad 432, for example, ultraviolet light is irradiated to the first adhesive layer 31 from the second inner substrate 21 side to weaken the adhesiveness of the first adhesive layer 31. Then, the semiconductor substrate 10 is peeled off from the second inner substrate 21. In the first and second embodiments, since the support substrate 20 is ground, the support substrate 20 is discarded. On the other hand, in the semiconductor device 1 according to the third embodiment, since the support substrate 20 is not ground, the support substrate 20 can be used repeatedly, and thus the manufacturing cost of the semiconductor device 1 can be reduced.

Figure 7:
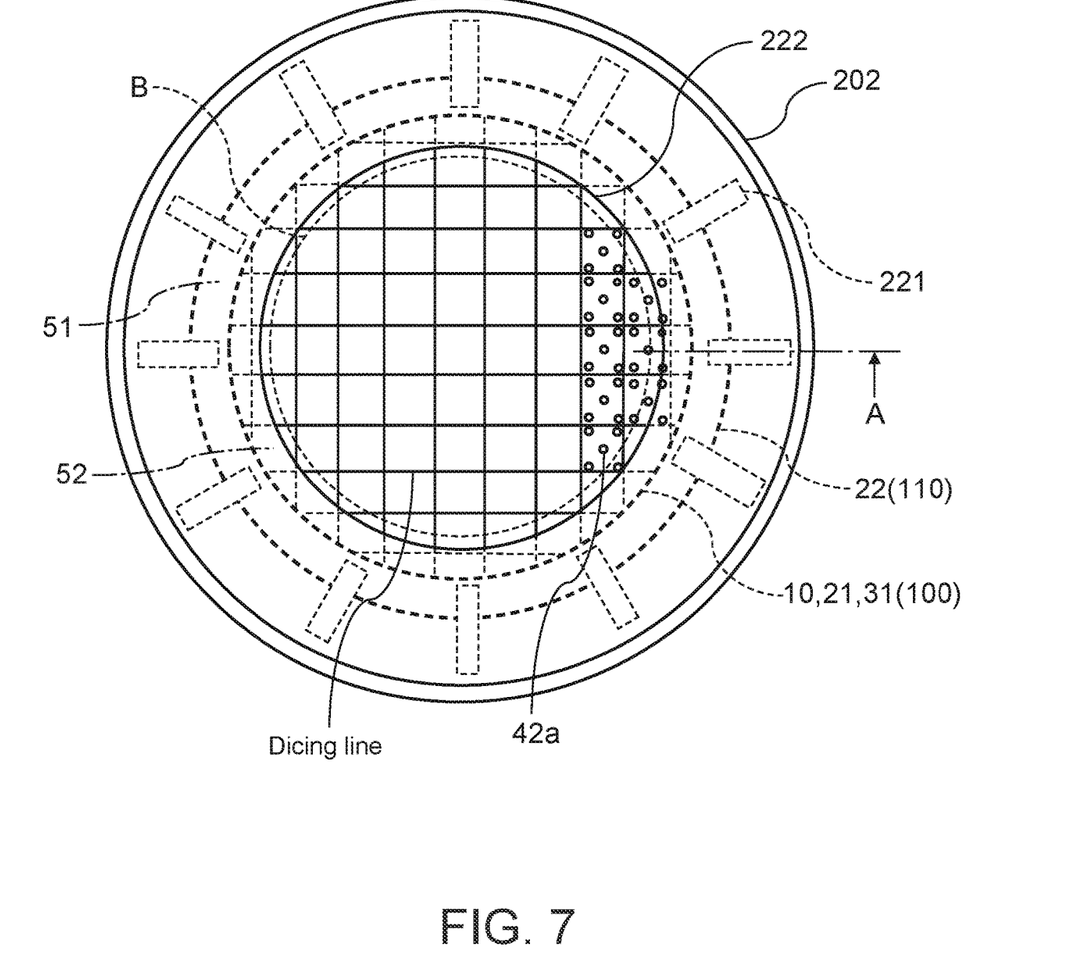
FIG. 7 is a plan view of an example of a configuration of the semiconductor device according to the first embodiment.

FIG. 7 is a plan view of the semiconductor device 1 held by the substrate holding unit 202 of the plating apparatus 200 in the first embodiment. The semiconductor substrate 10 will be divided into a plurality of chips by dicing along a dicing line. Although only five are shown in the drawing for the purpose of simplification, several hundreds to several thousands of the openings 42a may be formed in one chip. The illustration of the openings 42a is omitted except for a few of the chips. The plating solution 210, the seed layer 35 and the like are omitted. A cross-sectional view in which the peripheral edge portion indicated by an alternate long and short dash line viewed from the direction "A" corresponds to FIG. 3G. The seal contact area 52 of the semiconductor device 1 is in contact with the seal portion 222 all around the semiconductor device 1. The plurality of electrodes 221 are in contact with the electrode contact area 51 of the semiconductor device 1 at a plurality of points. The seal contact area 52 is at the end of the semiconductor substrate 10 and the electrode contact area 51 is on the second structure 110. A peeling layer is provided between the semiconductor substrate 10 and the second inner substrate 21 on the center side of the dotted circle B, and the first adhesive layer 31 is provided between the semiconductor substrate 10 and the second inner substrate 21 outside the dotted circle B.

Figure 8:
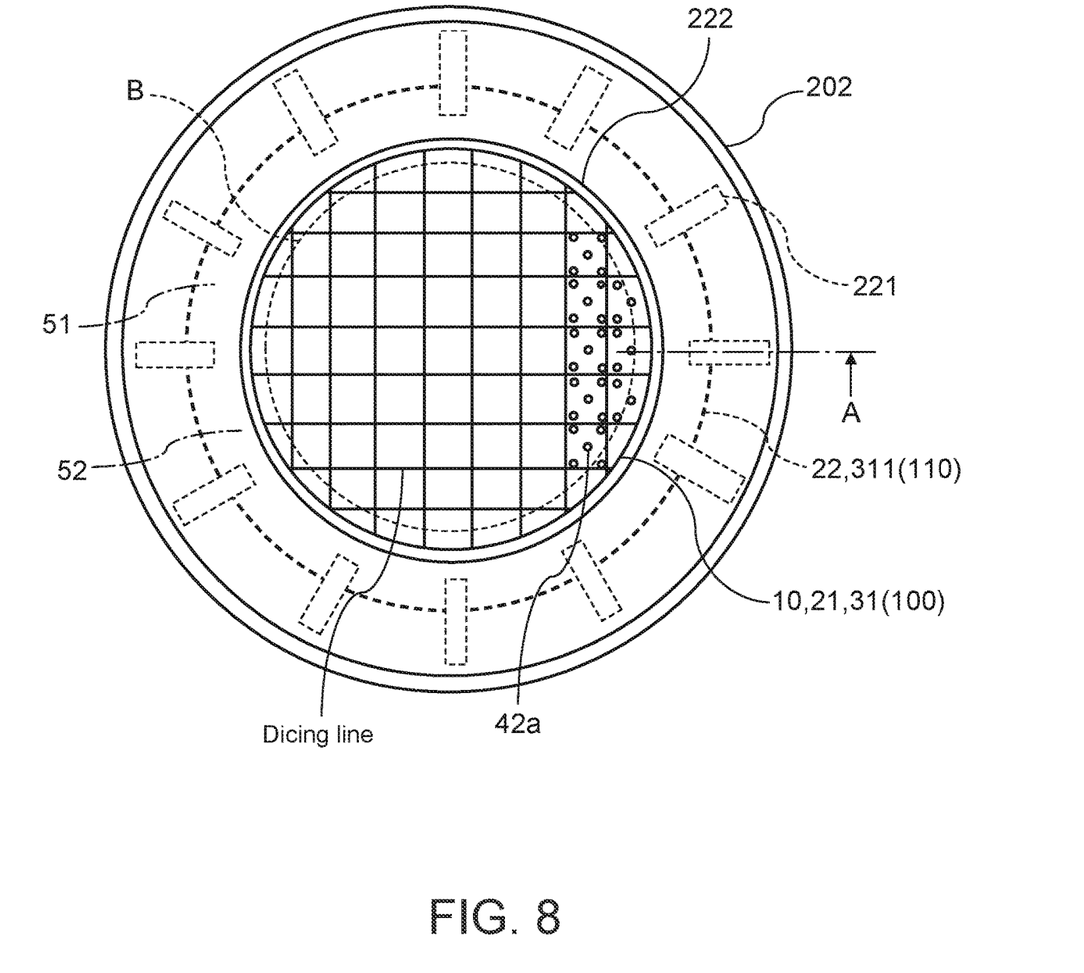
FIG. 8 is a plan view of an example of a configuration of the semiconductor device according to the second or third embodiment.

FIG. 8 is a plan view of the semiconductor device 1 held by the substrate holding unit 202 of the plating apparatus 200 in the second and third embodiments. The seal contact area 52 of the semiconductor device 1 contacts the seal portion 222 all around the semiconductor device 1. The plurality of electrodes 221 contact the electrode contact area 51 of the semiconductor device 1 at a plurality of points. The electrode contact area 51 and the seal contact area 52 are on the second structure 110. A cross-sectional view in which the peripheral edge portion indicated by an alternate long and short dash line viewed from the direction "A" corresponds to FIG. 5 in the second embodiment and FIG. 6 in the third embodiment. In the second embodiment, the second structure 110 is the second outer substrate 22. In the third embodiment, the second structure 110 is a stacked structure of the second outer substrate 22 and the second adhesive layer 311. The peeling layer is provided between the semiconductor substrate 10 and the second inner substrate 21 on the center side of the dotted circle B, and the first adhesive layer 31 is provided between the semiconductor substrate 10 and the second inner substrate 21 outside the dotted circle B.

In the embodiments described above, a semiconductor substrate 10 is used. However, if desired, an insulating material may be used for the material for the substrate 10. Further, in the above embodiments, the support substrate 20 is peeled off. However, if desired, it is possible to use the support substrate 20 as a device substrate of the semiconductor device that is not peeled off.

While certain embodiments of the present invention have been described, these embodiments have been presented by way of example only, and are not intended to limit the scope of the invention. These novel embodiments can be implemented in various other forms, and various omissions, substitutions, and modifications can be made without departing from the scope of the invention. These embodiments and modifications thereof are included in the scope and the gist of the invention, and are included in the invention described in the claims and the equivalent scope thereof.

What is claimed is:

1. A semiconductor device, comprising:
    a device layer including a semiconductor element and a wiring layer;
    a first structure comprising a first substrate having the device layer formed on a first surface thereof, and a through hole formed through a second surface thereof that is opposite to the first surface to reach the device layer, and an inner portion of a second substrate facing the first surface and bonded to the first surface by a first adhesive layer;
    a second structure at an outer periphery of the first structure, having a thickness smaller than that of the first structure and having two surfaces on opposite sides thereof, the two surfaces including a substantially flat surface and another surface that is farther from the device layer than the substantially flat surface;
    a conductive layer that physically contacts the first structure and the flat surface of the second structure; and
    an insulating film pattern formed on the conductive layer covering the first structure and on the conductive layer covering the second structure.

2. The semiconductor device according to claim 1, wherein the second structure includes an outer portion of the second substrate, that is thinner than the inner portion of the second substrate.

3. The semiconductor device according to claim 2, wherein the insulating film pattern formed on the conductive layer covering the second structure is a contact portion of a seal member of a substrate holding portion of a plating apparatus which has an electrode that is covered by the seal member, and the conductive layer physically contacting the flat surface of the second structure is a contact portion of the electrode.

4. The semiconductor device according to claim 1, wherein the second structure includes an outer portion of the second substrate, that has substantially the same thickness as the inner portion of the second substrate, and a second adhesive layer on the outer portion of the second substrate, that is thinner than the first adhesive layer.

5. The semiconductor device according to claim 4, wherein the insulating film pattern formed on the conductive layer covering the second structure is a contact portion of a seal member of a substrate holding portion of a plating apparatus which has an electrode that is covered by the seal member, and the conductive layer physically contacting the flat surface of the second structure is a contact portion of the electrode.

6. The semiconductor device according to claim 1, wherein the insulating film pattern is a contact portion of a seal member of a substrate holding portion of a plating apparatus which has an electrode that is covered by the seal member, and the conductive layer physically contacting the flat surface of the second structure is a contact portion of the electrode.

7. The semiconductor device according to claim 1, wherein a thickness of the first substrate is less than 30 μm.

8. A substrate for a semiconductor device, comprising:
    a first substrate having a device layer formed on a first surface thereof, and a through hole formed through a second surface thereof that is opposite to the first surface to reach the device layer;
    a second substrate having an inner portion facing the first surface and bonded to the first surface by an adhesive layer, and an outer portion that does not face the first surface; and
    a conductive layer covering the second surface, the through hole, and the outer portion of the second substrate, wherein the outer portion of the second substrate is thinner than the inner portion of the second substrate.

9. The semiconductor device according to claim 8, further comprising:
an insulating film pattern formed on the conductive layer covering the second surface and partially on the conductive layer covering the outer portion of the second substrate,
wherein the insulating film pattern formed partially on the conductive layer covering the outer portion of the second substrate is a contact portion of a seal member of a substrate holding portion of a plating apparatus which has an electrode that is covered by the seal member, and the conductive layer covering the outer portion of the second substrate and on which the insulating film pattern is not formed, is a contact portion of the electrode.

10. The substrate for the semiconductor device according to claim 8, further comprising:
an insulating film pattern formed on the conductive layer covering the second surface;
wherein the insulating film pattern is a contact portion of a seal member of a substrate holding portion of a plating apparatus which has an electrode that is covered by the seal member, and the conductive layer covering the outer portion of the second substrate is a contact portion of the electrode.

11. The substrate for the semiconductor device according to claim 8,
wherein a thickness of the first substrate is less than 30 µm.

12. A method of manufacturing a semiconductor device, comprising:
forming a device layer including a semiconductor element and a wiring layer on a first surface of a first substrate;
forming a stacked structure by bonding a second substrate to the first surface of the first substrate with an adhesive layer;
polishing the first substrate from a second surface thereof that is opposite to the first surface;
forming a through hole through the second surface of the first substrate until the device layer is exposed;
removing the first substrate at an outer periphery of the stacked structure;
forming a conductive layer to cover the second surface of the first substrate, the through hole, and the outer periphery of the stacked structure;
forming an insulation pattern partially on the conductive layer; and
filling the through hole covered by the conductive layer with metal to form a connection electrode for the device layer.

13. The method according to claim 12, further comprising:
pressing an electrode of a plating apparatus directly against the conductive layer formed on the outer periphery of the stacked structure; and
applying a voltage to the electrode of the plating apparatus while contacting the through hole with a plating solution to fill the through hole with the metal.

14. The method according to claim 13, further comprising:
while pressing the electrode of the plating apparatus directly against the conductive layer formed on the outer periphery of the stacked structure, pressing a seal member that covers the electrode of the plating apparatus against the insulation pattern formed on the conductive layer covering the second surface of the first substrate.

15. The method according to claim 12, further comprising:
removing all of the adhesive layer at the outer periphery of the stacked structure and part of the second substrate at the outer periphery of the stacked structure, after the first substrate is removed from the outer periphery of the stacked structure.

16. The method according to claim 13, further comprising:
while pressing the electrode of the plating apparatus directly against the conductive layer formed on the outer periphery of the stacked structure, pressing a seal member that covers the electrode of the plating apparatus against the insulation pattern formed on the outer periphery of the stacked structure.

17. The method according to claim 12, further comprising:
removing a part of the adhesive layer at the outer periphery of the stacked structure, after the first substrate is removed from the outer periphery of the stacked structure.

18. The method according to claim 13, further comprising:
while pressing the electrode of the plating apparatus directly against the conductive layer formed on the outer periphery of the stacked structure, pressing a seal member that covers the electrode of the plating apparatus against the insulation pattern formed on the outer periphery of the stacked structure.

19. The method according to claim 12,
wherein a thickness of the first substrate is less than 30 µm.

* * * * *